United States Patent
De Wit et al.

(10) Patent No.: US 10,191,396 B2
(45) Date of Patent: Jan. 29, 2019

(54) LITHOGRAPHIC APPARATUS, OBJECT POSITIONING SYSTEM AND DEVICE MANUFACTURING METHOD

(71) Applicant: ASML NETHERLANDS B.V., Veldhoven (NL)

(72) Inventors: Paul Corné Henri De Wit, Eindhoven (NL); Stijn Willem Boere, Eindhoven (NL); Youssef Karel Maria De Vos, Lille (BE); Peter Paul Hempenius, Nuenen (NL); Nicolaas Rudolf Kemper, Eindhoven (NL); Robertus Mathijs Gerardus Rijs, Sevenum (NL); Frits Van Der Meulen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 59 days.

(21) Appl. No.: 15/316,526

(22) PCT Filed: May 21, 2015

(86) PCT No.: PCT/EP2015/061193
§ 371 (c)(1),
(2) Date: Dec. 6, 2016

(87) PCT Pub. No.: WO2015/193053
PCT Pub. Date: Dec. 23, 2015

(65) Prior Publication Data
US 2018/0149986 A1    May 31, 2018

(30) Foreign Application Priority Data
Jun. 19, 2014  (EP) .................................... 14173146

(51) Int. Cl.
*G03F 7/20* (2006.01)
*G03F 9/00* (2006.01)

(52) U.S. Cl.
CPC ............ *G03F 9/7073* (2013.01); *G03F 7/709* (2013.01); *G03F 7/70725* (2013.01);
(Continued)

(58) Field of Classification Search
CPC .. G03F 7/7016; G03F 7/70725; G03F 7/7085; G03F 7/70875; G03F 7/70341
See application file for complete search history.

(56) References Cited

U.S. PATENT DOCUMENTS 7,804,575 B2  9/2010  Cadee et al.
8,786,830 B2  7/2014  De Metsenaere et al.
(Continued)

FOREIGN PATENT DOCUMENTS

CN  101051188  10/2007
CN  101510052   8/2009
(Continued)

OTHER PUBLICATIONS

International Search Report and Written Opinion dated Sep. 15, 2015 in corresponding International Patent Application No. PCT/EP2015/061193.
(Continued)

*Primary Examiner* — Steven Whitesell Gordon
(74) *Attorney, Agent, or Firm* — Pillsbury Winthrop Shaw Pittman LLP

(57) ABSTRACT

A temperature conditioning system for a lithographic apparatus. Temperature variations in an object cause object deformation which prevents the object being accurately positioned. Temperature condition systems use conduit systems, provided with fluid, in or on the object to control the temperature of the object to reduce object deformation. In
(Continued)

this way, parts of the object can be more accurately positioned. However, acceleration of the object and the temperature conditioning system induces variation in pressure within the fluid inside the conduit system on or in the object, which may also cause object deformation. To provide an improved conduit system, the lithographic apparatus further includes a control system which is used to control the movement of the object based on measurements indicating pressure variation in the conduit.

20 Claims, 4 Drawing Sheets

(52) U.S. Cl.
CPC ...... *G03F 7/70875* (2013.01); *G03F 7/70891* (2013.01); *G03F 7/20* (2013.01)

(56) References Cited

U.S. PATENT DOCUMENTS

| | | |
|---|---|---|
| 8,913,228 B2 | 12/2014 | Wijckmans et al. |
| 9,261,799 B2 | 2/2016 | Butler |
| 9,946,172 B2* | 4/2018 | Hempenius .......... G03F 7/70875 |
| 2002/0189897 A1 | 12/2002 | Trochon |
| 2006/0033898 A1 | 2/2006 | Cadee et al. |
| 2006/0077367 A1* | 4/2006 | Kobayashi ............. G03B 27/52 355/53 |
| 2007/0177118 A1 | 8/2007 | Sogard |
| 2007/0242245 A1 | 10/2007 | Wijckmans et al. |
| 2008/0129969 A1 | 6/2008 | Peng et al. |
| 2008/0309910 A1* | 12/2008 | Takahashi ............. F16F 15/027 355/72 |
| 2010/0290013 A1* | 11/2010 | De Metsenaere ...... G03B 27/52 355/30 |
| 2011/0211178 A1 | 9/2011 | Sogard et al. |
| 2011/0222032 A1 | 9/2011 | Ten Kate et al. |
| 2014/0071523 A1 | 3/2014 | Hartjes et al. |
| 2016/0377996 A1* | 12/2016 | Hempenius ......... G03F 7/70875 355/30 |

FOREIGN PATENT DOCUMENTS

| | | |
|---|---|---|
| CN | 101587357 | 11/2009 |
| CN | 102129179 | 7/2011 |
| DE | 10 2013 213 855 | 7/2014 |
| EP | 1 843 206 | 10/2007 |
| JP | 2005-308145 | 11/2005 |
| JP | 2008-505485 | 2/2008 |
| JP | 2009-037391 | 2/2009 |
| JP | 2010-045300 | 2/2010 |
| JP | 2010-114397 | 5/2010 |
| WO | 2006/007111 | 1/2006 |

OTHER PUBLICATIONS

International Preliminary Report on Patentability dated Dec. 29, 2016 in corresponding International Patent Application No. PCT/EP2015/061193.
Chinese Office Action dated Sep. 30, 2017 in corresponding Chinese Patent Application No. 201580032779.8.
Japanese Office Action dated Dec. 19, 2017 in corresponding Japanese Patent Application No. 2016-574104.
Korean Office Action dated Jan. 9, 2018 in corresponding Korean Patent Application No. 10-2016-7036153.
Chinese Office Action issued in corresponding Chinese Patent Application No. 201580032779.8, dated Aug. 3, 2018.

* cited by examiner

LITHOGRAPHIC APPARATUS, OBJECT POSITIONING SYSTEM AND DEVICE MANUFACTURING METHOD

CROSS-REFERENCE TO RELATED APPLICATIONS

This application is the U.S. national phase entry of PCT patent application no. PCT/EP2015/061193, which was filed on May 21, 2015, which claims the benefit of priority of EP patent application no. 14173146.3, which was filed on Jun. 19, 2014, and which is incorporated herein in its entirety by reference.

FIELD OF THE INVENTION

The present invention relates to a lithographic apparatus, an object positioning system and a device manufacturing method.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once. Conventional lithographic apparatus include so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus usually comprises one or more objects that need to be positioned, e.g. a substrate table or a support structure. More particularly a specific point, referred to as the point of interest, on, or related to, the object needs to be positioned accurately. For example, the point of interest may be at the target portion. It may not be possible to directly measure the position of the point of interest. Therefore, the position of another point, referred to as the measured point, is measured. The position of the point of interest relative to the measured point is assumed. However, temperature variation and other effects can cause deformation of the object leading to changes in the position of the point of interest relative to the measured point. If the temperature variation and other effects are not taken into account in position control, errors in the position of the point of interest can arise.

To reduce temperature differences in an object, a temperature conditioning system may be provided. The temperature conditioning system may comprise a conduit system, arranged on or in the object. The temperature conditioning system may be configured to receive a fluid within the conduit system. The fluid can be used to transport heat from or to the object depending on the thermal condition of the object. Using the temperature conditioning system controls the object temperature, and therefore may reduce deformation, which may reduce the error in positioning the point of interest.

SUMMARY OF THE INVENTION

Acceleration in a direction of acceleration of an object, a conduit system and fluid therein, causes a pressure gradient in the fluid opposite to the direction of acceleration. This pressure gradient may excite a resonance mode of the fluid in the conduit system which can lead to the occurrence of pressure pulses within the conduit system. The pressure pulses can result in a significant dynamic disturbance force on the object. The resulting disturbance force adversely affects the accuracy of positioning the object. For example, variations in pressure in the conduit system may cause a disturbance force to act on the object, and in some cases, also cause a part of the object to deform. Therefore, even though the temperature conditioning system may reduce object deformation to improve the accuracy of positioning of the object, the variation in pressure may cause deformation. The deformation caused by the variation in pressure may reduce the effectiveness of the temperature conditioning system. If the object is a substrate table holding a substrate to be exposed, a small deformation of the substrate table may alter the position of the substrate and cause, or increase, an overlay error and/or a focus error in the patterning of the substrate.

It is therefore desirable to provide an improved positioning of a point on the object.

According to an embodiment of the present invention, a lithographic apparatus is provided comprising: an object that is movable in at least one direction; a conduit system for conveying a fluid, wherein at least part of the conduit system is arranged on or in the object; a measurement system comprising a sensor to provide a measurement signal which is indicative of a pressure of the fluid at at least one location within the conduit system; and a control system to control the movement of the object in the at least one direction under control of the measurement signal.

According to another embodiment of the present invention, an object positioning system is provided comprising: an object that is movable in at least one direction; a conduit system for conveying a fluid, wherein at least part of the conduit system is arranged on or in the object;
a measurement system comprising a sensor to provide a measurement signal which is indicative of a pressure of the fluid at at least one location within the conduit system; and a control system to control the movement of the object in the at least one direction under control of the measurement signal.

According to another embodiment of the present invention, a lithographic apparatus is provided comprising: an object that is movable in at least one direction; a conduit system for conveying a fluid, wherein at least part of the conduit system is arranged on or in the object; a pressure predictor system configured to generate a signal which is indicative of a predicted pressure of the fluid at at least one location within the conduit system; and a control system to control the movement of the object in the at least one direction under control of the signal.

According to another embodiment of the present invention, a device manufacturing method is provided in which use is made of a lithographic apparatus of the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
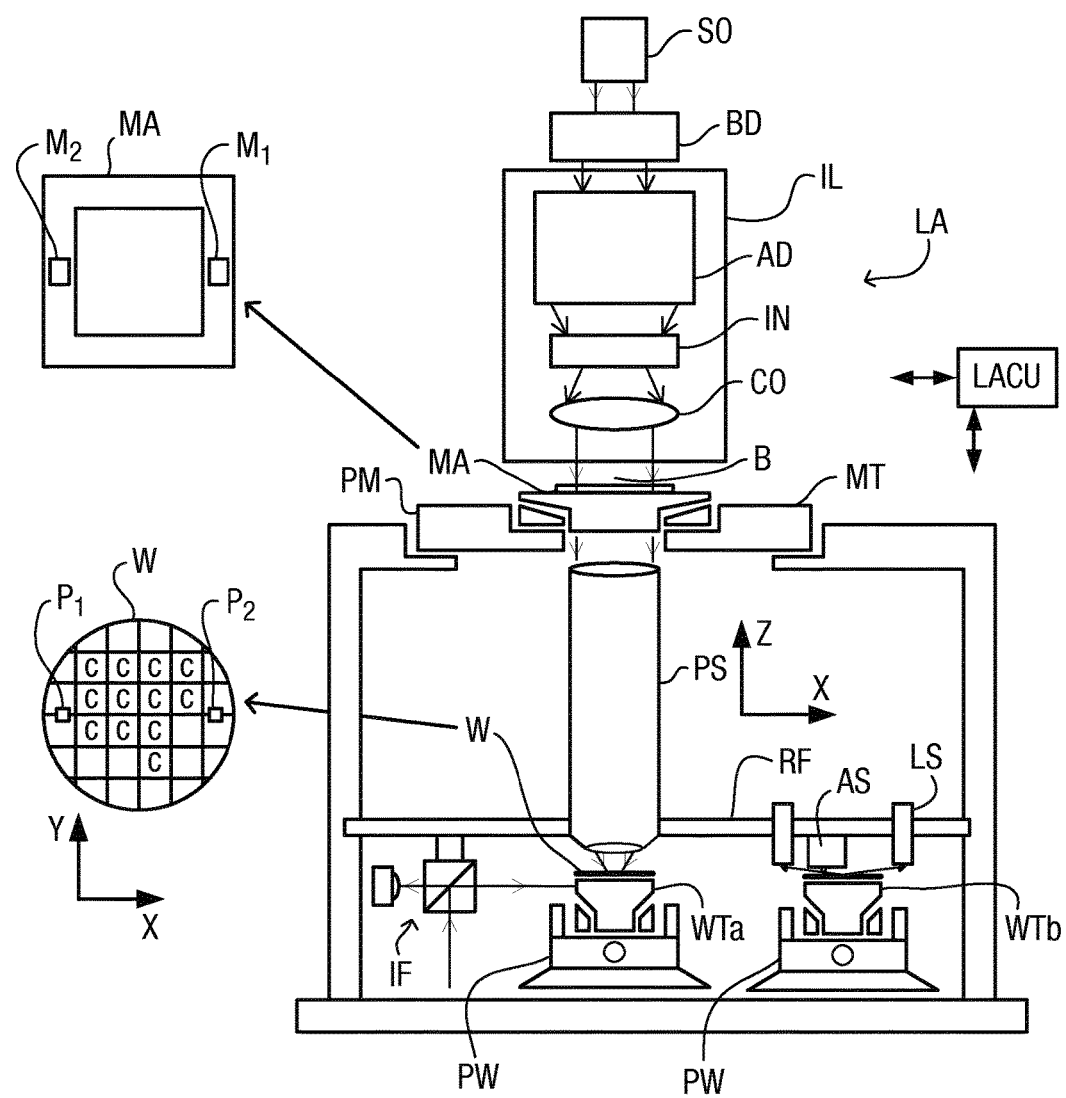
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B.
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WTa or WTb constructed to hold a substrate (e.g. a resist-coated wafer) W and connected to a second positioner PW configured to accurately position the substrate W in accordance with certain parameters; and
- a projection system PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompasses all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive patterning device MA). Alternatively, the apparatus may be of a reflective type (e.g. employing a programmable mirror array of a type as referred to above, or employing a reflective patterning device).

The lithographic apparatus may be of a type having two (dual stage) or more substrate tables WT (and/or two or more support structures). In such "multiple stage" machines the additional tables may be used in parallel, or preparatory steps may be carried out on one or more tables while one or more other tables are being used for exposure. The lithographic apparatus may comprise a measurement table that is arranged to hold measurement equipment, such as sensors to measure properties of the projection system PS. In an embodiment, the measurement table is not able to hold a substrate W. The two substrate tables WTa and WTb in the example of FIG. 1 are an illustration a dual stage lithographic apparatus.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus LA may be separate entities, for example when the radiation source SO is an excimer laser. In such cases, the radiation source SO is not considered to form part of the lithographic apparatus LA. In such cases, the radiation beam is passed from the radiation source SO to the illumination system IL with the aid of a beam delivery system BD comprising, for example, suitable directing mirrors and/or a beam expander. In other cases the radiation source SO may be an integral part of the lithographic apparatus LA, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator can be adjusted. In addition, the illumination system IL may comprise various other components, such as an integrator IN and a condenser CO. The illumination system IL may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (comprising e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the patterning device MA may be realized with the aid of a long-stroke module and a short-stroke module, which both form part of the first positioner PM. The long-stroke module is arranged to move the short-stroke module over a long range with limited precision. The short-stroke module is arranged to move the patterning device MA over a short range relative to the long-stroke module with a high precision. Similarly, movement of the substrate table WTa/WTb may be realized using a long-stroke module and a short-stroke module, which both form part of the second positioner PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Marks located in spaces between the target portions C are known as scribe-lane alignment marks. Similarly, in situations in which more than one die is provided on the patterning device MA, the mask alignment marks M1, M2 may be located between the dies.

The depicted apparatus may be used to expose a substrate by using the lithographic apparatus LA in a variety of modes. For example, an exposure can be formed in a scan mode wherein the velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

The lithographic apparatus LA of FIG. 1 is of a so-called dual stage type which has two substrate tables WTa and WTb and two stations—an exposure station and a measurement station—between which the substrate tables WT can be exchanged. While one substrate W on one substrate table WT is being exposed at the exposure station, another substrate W can be loaded onto the other substrate table WT at the measurement station so that various preparatory steps may be carried out. The preparatory steps may include mapping the surface of the substrate W using a level sensor LS and measuring the position of substrate alignment marks P1, P2 on the substrate W using an alignment sensor AS. This enables a substantial increase in the throughput of the apparatus. If the position sensor IF is not capable of measuring the position of the substrate table WT while it is at the measurement station as well as at the exposure station, a second position sensor may be provided to enable the positions of the substrate table WT to be tracked at both stations. Instead of two substrate tables WTa and WTb, the lithographic apparatus may comprise one substrate table WT and a measurement table that is arranged to hold measurement equipment, such as sensors to measure properties of the projection system PS.

The lithographic apparatus LA further includes a lithographic apparatus control unit LACU which controls all the movements and measurements of the various actuators and sensors described. The lithographic apparatus control unit LACU also includes signal processing and data processing capacity to implement desired calculations relevant to the operation of the apparatus. In practice, the lithographic apparatus control unit LACU will be realized as a system of many sub-units, each handling the real-time data acquisition, processing and control of a subsystem or component within the apparatus. For example, one processing subsystem may be dedicated to servo control of the second positioner PW. Separate units may handle different actuators, or different axes. Another sub-unit might be dedicated to the readout of the position sensor IF. Overall control of the lithographic apparatus LA may be controlled by a central processing unit. The central processing unit may communicate with the sub-units, with operators and with other apparatuses involved in the lithographic manufacturing process.

The support structure MT and the substrate tables WTa/WTb are examples of objects within the lithographic apparatus that may need to be positioned accurately relative to a reference, e.g. the projection system PS. Other examples of objects that may be positionable are optical elements in the projection system PS or the positioners themselves, e.g. the first positioner PM and/or the second positioner PW.

In order to position objects relative to a reference within the lithographic apparatus LA, the lithographic apparatus LA comprises at least one object positioning system according to the invention, which will be described in more detail below.

Figure 2:
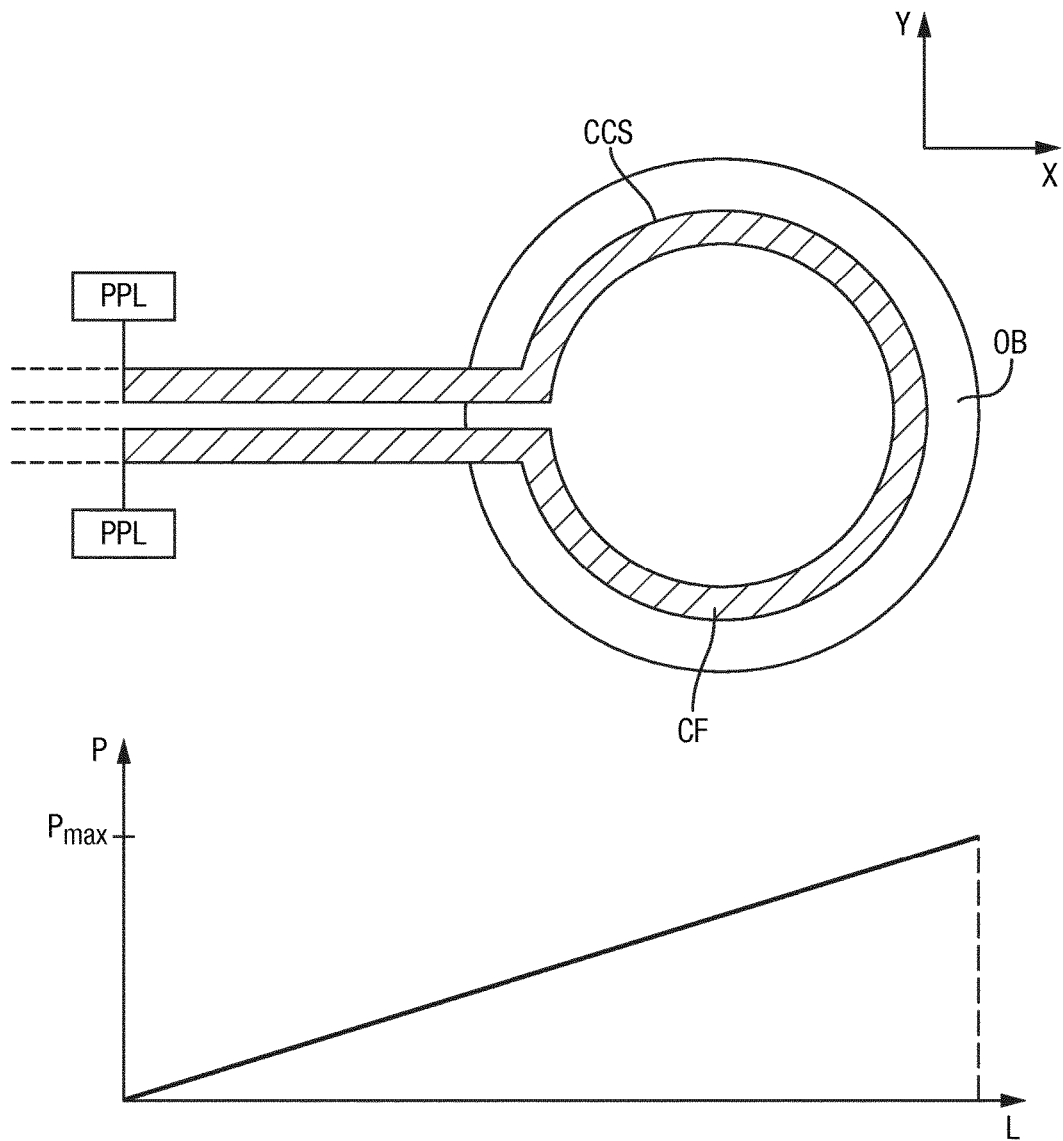
FIG. 2 depicts an object including a conduit system containing fluid with pressure pulse limiters, for reference, and a model of the pressure variation of the fluid within the conduit system.

A temperature conditioning system can be used to control the temperature of an object OB by providing fluid CF in a conduit system CCS on or in the object OB, see FIG. 2. The placement of the conduit system CCS on or in the object OB is generally chosen to optimize temperature control of the object OB. However, despite the advantages provided by using a temperature conditioning system, disturbances in the fluid CF within the conduit system CCS may affect the object OB. These disturbances may adversely affect the accuracy of the positioning of the object OB.

The conduit system CCS may be connected to a stationary part of the lithographic apparatus LA via a hose. The hose may be carried by a carrier system that is arranged between the object OB and the stationary part. To isolate the conduit system CCS from dynamic disturbances caused by movement of the carrier system, the conduit system CCS may comprise at least one pressure pulse limiter PPL. For example, the pressure pulse limiter PPL can take the form of a pressure vessel or an expansion vessel. The pressure pulse limiter PPL may be located at any point on the carrier system or the conduit system CCS. The pressure pulse limiter PPL may be at the connection between the carrier system and the conduit system CCS. The pressure pulse limiter PPL may be placed as close as possible to the object OB.

The fluid CF within the conduit system CCS can be described as a dynamical system. The dynamical system represents the fluid CF in the object OB as a system of masses and springs. For example, the fluid CF in the conduit system CCS may act as a multi-mass spring damper system in the longitudinal direction of the conduit system CCS due to, for instance, the elasticity of the fluid CF and/or the elasticity of the conduit system CCS and/or the elasticity of the hose that may be connected to the conduit system CCS.

Each pressure pulse limiter PPL can be represented by a very soft spring in the dynamical system and may act as an open end in the dynamical system. The pressure pulse limiter PPL may cancel out pressure variations in the fluid CF introduced from outside the conduit system CCS, e.g. by the carrier system. Therefore the fluid CF in the conduit system CCS may be modelled as an isolated system. Locating the pressure pulse limiter PPL as close as possible to the object OB can reduce pressure variations in the fluid CF.

Even when a pressure pulse limiter PPL effectively isolates the system, the fluid CF in the conduit system CCS gives rise to significant disturbances. It has been found that acceleration of the object OB in a direction of acceleration causes pressure gradients in the fluid CF within the conduit system CCS. The pressure gradients may excite a resonance mode of the fluid CF in the conduit system CCS which lead to the occurrence of pressure pulses. In addition or alternatively, pressure gradients in the fluid CF within the conduit system CCS may be created by acceleration of a hose that connects to the conduit system CCS. The hose may be flexible and may deform when the object OB is accelerated, causing a pressure gradient in the fluid CF.

During acceleration, a change in pressure is generated in the conduit system CCS which may be governed by the following simplified equation:

$$\text{Change in pressure} = \rho \cdot \text{acceleration} \cdot L$$

wherein L is the distance of a point (at which the change in pressure is being calculated) to the pressure pulse limiter PPL and $\rho$ is the density of the fluid CF. The change in pressure may be referred to as the change in quasistatic pressure. The magnitude of the change in pressure will be largest in the substrate table WT, since the pressure variation at the pressure pulse limiters PPL is 0 in principle when the pressure pulse limiters PPL are located in specific locations, for example as in FIG. 2. An example of a conduit system CCS and a model of the pressure variation of the prior art is shown in FIG. 2. Placing the pressure pulse limiters PPL as close as possible to the substrate table WT, preferably below the substrate table WT, reduces the pressure variation in the fluid CF in the substrate table WT. However, it is generally not possible to place the pressure pulse limiters PPL below the substrate table WT due to the respective sizes of the pressure pulse limiters PPL and the substrate table WT, and there may be the other components which are needed on or in the substrate table WT.

As an example, the pressure change during acceleration might reach approximately 0.1-0.3 bar. In an example, a mechanical sensitivity of the substrate table WT is 7 nm/bar. The mechanical sensitivity may be of any reasonable value, e.g. within the range 0.01-20 nm/bar, or 0.1-10 nm/bar. The mechanical sensitivity indicates the relationship between the deformation of the object OB and the pressure of the fluid CF. The mechanical sensitivity may be affected by the object stiffness. The material used for the object OB may be chosen, or the object OB may be manufactured in a way to vary and select the mechanical stiffness. The mechanical sensitivity may be determined by testing the response of an object OB to different pressure variations, e.g. by measuring the deformation of the object OB. In this example, there is a linear increase in pressure across the substrate table WT. In this example, there would be a local displacement of the substrate table WT of approximately 0.7-2.1 nm at the edge of the substrate table WT and therefore a similar deformation of the substrate W which is held by the substrate table. Therefore, the point of interest which may be on the substrate, for example a target portion C, would move relative to the measured point and the relative position of the point of interest would no longer be accurately known. The measured point is a location on the object at which a position measurement system is arranged to take a position measurement. The measured point may be a fixed location on the object, or may be a location that changes in dependency of a position of the object.

Furthermore, if different parts of the object OB deform in different ways, for example if the point of interest moves due to deformation in one direction and the measured point moves due to deformation in another direction, the error in the known position of the point of interest relative to the measured point is the combined error, which may be even greater.

The local displacement of the substrate W (due to the deformation of the substrate table WT) can be referred to as a radial position error. Radial position errors tend to be larger towards the edge of the substrate W and increase as the substrate size increases. Therefore, although controlling the temperature of the object OB may reduce the error in overlay, there may still be some deformation of the object OB. The potential reduction provided by the temperature conditioning system is limited due to the error induced by the temperature conditioning system itself. Reducing the error induced by the temperature conditioning system may reduce the overall error and therefore, reduce overlay.

The fluid CF that runs through the conduit system CCS may exhibit longitudinal dynamics, independent of flow phenomena. The first resonant frequency may, for example, be at about 50 Hz. The resonant frequency is not that far from the frequency of stage movements which means that movement required by the lithographic apparatus LA to pattern the substrate W is also likely to induce pressure pulses that reduce the accuracy of the positioning of a point of interest on the substrate W being patterned. The dynamics of the fluid CF are typically poorly damped. The mode corresponding to the first frequency can be excited by accelerations in the X and/or Y direction. The pressure pulses in the substrate table WT may be easily excited at the resonant frequencies and may still be present during exposure of the substrate W.

The present invention aims to provide an object positioning system which further improves the advantages of using a temperature conditioning system. The present invention does this by measuring, determining or estimating the pressure of the fluid CF within the conduit system CCS and by basing the control of the position of the object OB on these measurements.

Figure 3:
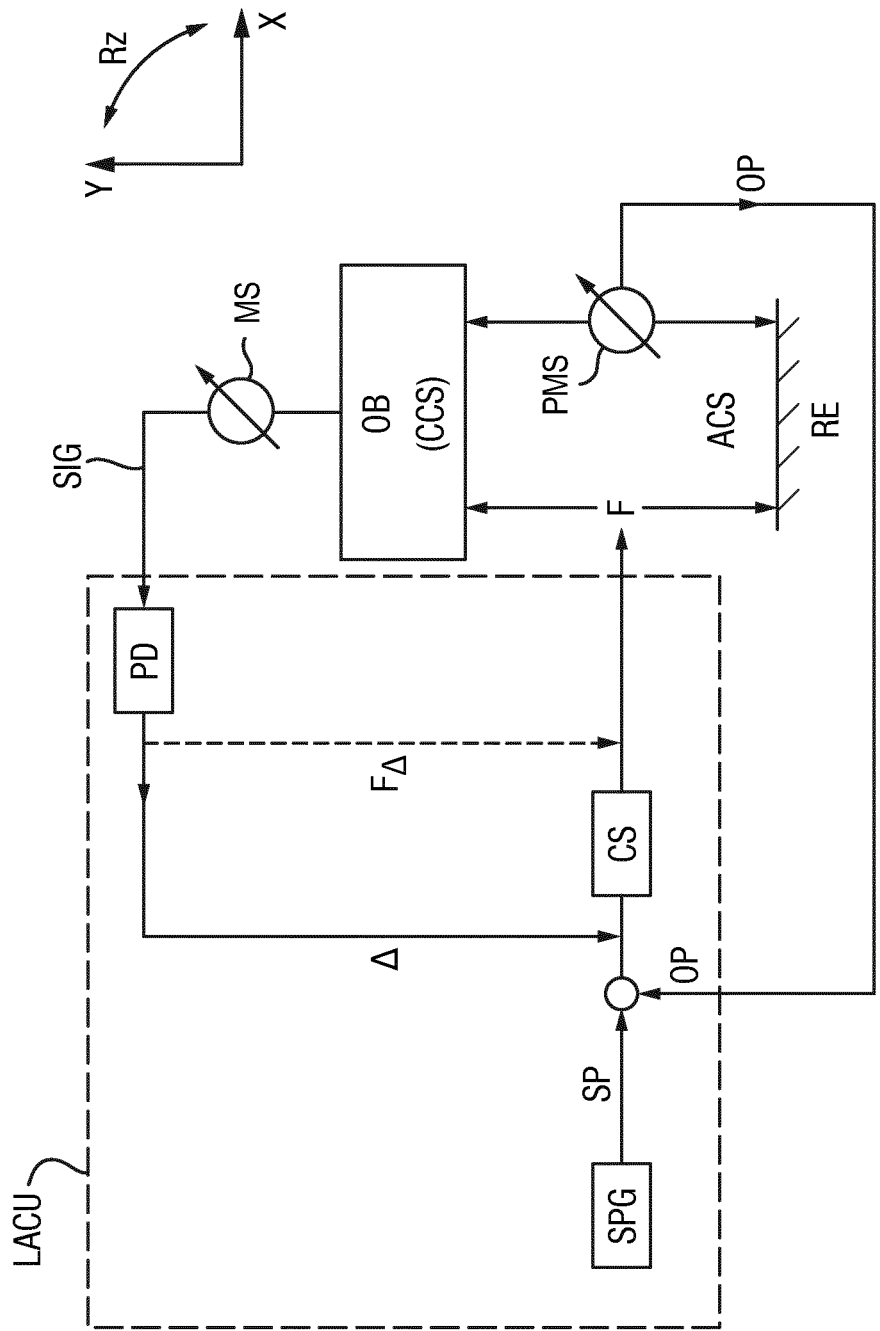
FIG. 3 depicts an object positioning system according to an embodiment of the invention.

An example of an object positioning system of an embodiment of the present invention is schematically depicted in FIG. 3 and comprises an object OB, e.g. a substrate table WT or support structure MT as shown in FIG. 1, to be positioned relative to a reference RE, e.g. a projection system PS. The object OB has a conduit system CCS on or in the object OB which is represented in combination with the object OB in FIG. 3. The conduit system CCS is provided with fluid CF. A position measurement system PMS is also shown with one or more sensors, e.g. position sensors IF of FIG. 1, for providing an output OP based on the position of the object OB in one or more degrees of freedom, e.g. translational directions X and/or Y and/or rotational direction Rz, relative to the reference RE. Also shown is a measurement system MS with one or more sensors, e.g. a pressure sensor, for providing an output which is a measurement signal SIG based on pressure of the fluid CF within the conduit system CCS. The measurement signal SIG is transmitted to a predictor PD which is used to produce signal Δ. The signal Δ indicates an estimated offset between the measured point and the point of interest, based on the measurement from the measurement system MS.

Furthermore, an actuator system ACS is shown. The actuator system ACS may have one or more actuators for positioning the object OB, preferably by applying a force F to the object OB. Also shown is a control system CS, configured to drive the actuator system ACS. The control system CS may be configured to control the actuator system ACS to position the object OB based on the output OP of the position measurement system PMS' the signal Δ and a set point SP representing a desired position of the object OB.

In FIG. 3 the actuator system ACS is shown as applying a force F between the object OB and the reference RE. The reference RE is used by the position measurement system PMS to determine the position of the object OB relative to the reference RE. However, it is not necessary that the force F is applied to the reference RE. In order to minimize disturbances as a result of the applied forces a separate force frame (not shown) may be provided. The separate force frame may be decoupled from the reference RE such that a force F may be applied to the object OB without disturbing the reference RE.

The control system CS controls the position of the object OB in at least one direction using the actuator control system ACS. For example, the at least one direction may be any of the translational directions X and/or Y and/or a rotational direction Rz. The at least one direction may correspond to a main moving direction during a critical operation of the object OB. For example, the critical operation may include moving the object OB during scanning, or stepping, or measuring, etc.

In FIG. 3 the position measurement system PMS is shown as measuring the position of the object OB relative to the reference RE. The position measurement system PMS measures the position of the object OB at a measured point on the object OB. Although this figure may suggest that a direct measurement is performed, it is also possible that the position measurement system PMS is configured to measure the position of the object OB relative to another structure. Examples of degrees of freedom which can be measured by the position measurement system PMS are an X-direction, a Y-direction perpendicular to the X-direction, and a rotational direction Rz about an axis perpendicular to both the X-and Y-direction, commonly referred to as the Z-direction. The position measurement system PMS may comprise any type of position sensor, for example, interferometric devices, encoder grid plates, accelerometers and capacitative sensors, etc.

In FIG. 3, the measurement system MS is shown as measuring a characteristic of the object OB or the conduit system CCS. The measurement system MS comprises a sensor SE (not shown in FIG. 3) to provide a measurement signal SIG. The measurement system MS may be a pressure measurement system. The measurement signal SIG is indicative of the pressure of the fluid CF at at least one point in the conduit system CCS. The measurement system MS may comprise a sensor SE to directly measure the pressure of the fluid CF, e.g. a pressure sensor. A sensor SE used to directly measure the pressure measures the pressure of the fluid CF. A sensor SE used to indirectly measure the pressure measures another characteristic of the fluid CF and/or the conduit system CCS. The indirect measurement may be used to determine the pressure.

Various types of pressure sensor may be used. In an embodiment, a high frequency pressure sensor is used. In this context, a high-frequency pressure sensor is one which takes measurements fast enough to accurately measure high speed movements of the object OB and/or the pressure pulses in the fluid CF. In some cases a piezoelectric pressure sensor may be used. Alternatively, a fibre Bragg grating may be used.

The output from the measurement system MS is a measurement signal SIG which is sent to a predictor PD. The predictor PD converts the measurement signal SIG to represent the estimated offset of the object OB in a specific direction at a measured location based on the measured pressure. The estimated offset is the estimated spatial change of the point of interest relative to the measured point due to the pressure. In FIG. 3, the signal representing the estimated offset is depicted as Δ. Δ is provided to the control system CS by the predictor PD. The estimated offset may be determined by the predictor PD using a dynamical model of the system. Alternatively, the predictor may use some sort of calibration process to determine the relationship between the estimated offset and the measured pressure.

Figure 4:
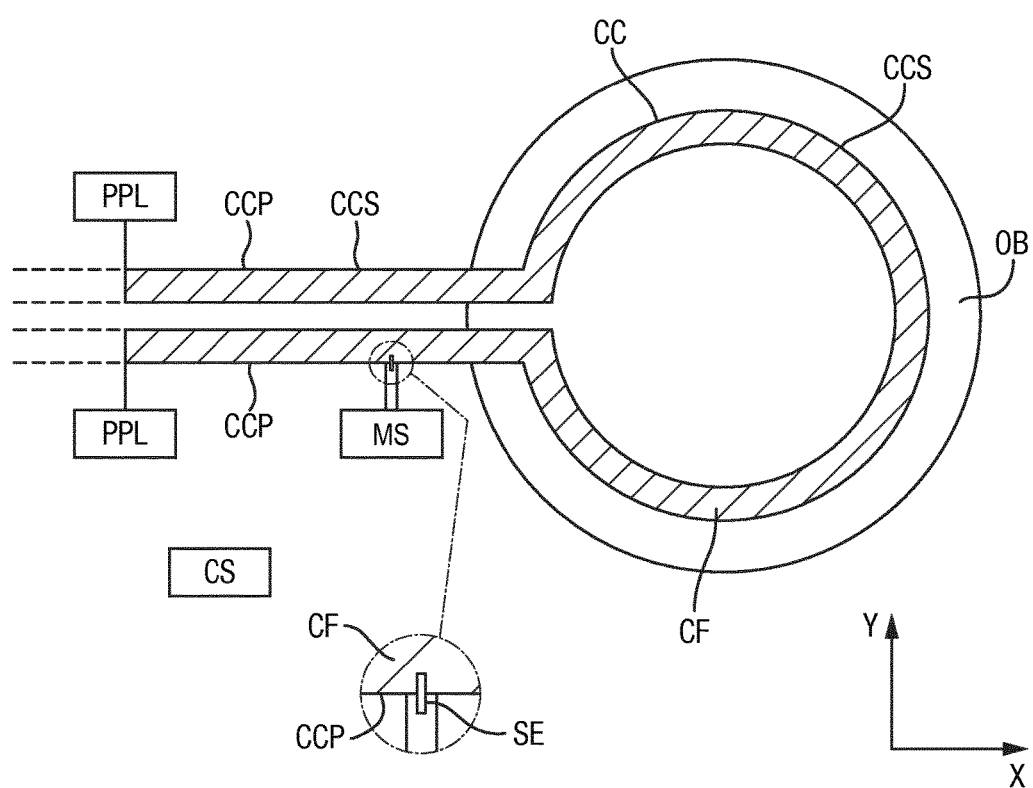
FIG. 4 depicts an object including a conduit system according to an embodiment of the invention.

The position of the point of interest in the X direction and the Y direction shown in FIGS. 2, 3 and 4 may affect the estimated offset. As previously mentioned, the error tends to be larger at the edge of the substrate W. Conversely, the error may be small or even negligible at specific points, for example in the centre of the substrate W. Therefore, the estimated offset may be calculated based on the position in the X direction and the Y direction of the point of interest, based on the variation of the deformation induced at different positions.

The estimated offset is calculated by the predictor PD based on the output (i.e. the measurement signal SIG) representing the pressure measured by the measurement system MS. In this embodiment, the predictor PD estimates the offset using a predetermined relationship between the measured pressure and the estimated offset that would be caused by the change in pressure. For example, as described above, when the mechanical sensitivity is assumed constant, the deformation within the object OB, i.e. the estimated offset, may be directly proportional to the pressure. Therefore, the estimated offset and the pressure may have a linear relationship with a predetermined constant. The relationship between the pressure and the estimated offset may be more complex. A structural model may be used to estimate the offset. The relationship between the pressure and the estimated offset may be derived empirically for example, by using some sort of calibration process to determine the relationship between the estimated offset and the measured pressure. Using the estimated offset in the control system CS means that the object OB can be controlled to counteract the effect of the disturbance forces. Therefore, the error induced by the temperature conditioning system can be reduced. In this way, the object OB may be more accurately positioned than if the control system CS does not use the estimated offset when controlling the position of the object OB.

The set point SP may be provided to the control system CS by a set point generator SPG. The set point generator SPG, the predictor PD and/or the control system CS may be part of a lithographic apparatus control unit LACU as also depicted in FIG. 1.

As shown in FIG. 3, there are three inputs to the control system CS, A from the predictor PD (which as described above is a signal representing the estimation of the offset induced by the temperature conditioning system based on the pressure measurement of the fluid within the conduit system CCS), the output OP from the position measurement system PMS (which is representative of the actual position of the object OB), and the set point SP (which is representative of the desired position of the object OB). From the three inputs, the control system CS determines the force required to position the object OB in the desired position. As such, the control system CS may control the movement of the object OB in at least one direction based on the output indicative of fluid pressure, the position measurement and the set point representing the desired position of the object OB.

As mentioned, the output OP from the position measurement system PMS is representative of the measured point on the object OB. The control system CS can use the position of the measured point to determine the actual position of the point of interest using the known relationship the between point of interest and the measured point. Although the relationship between these points is known (or at least assumed), any deformation in the object OB would induce an error in the position of the point of interest relative to the measured point. The estimated offset may be used to reduce, or remove, the error in the known relationship between the measured point and the point of interest. The control CS system uses these inputs to position the point of interest at the desired position.

In FIG. 3, a dashed line has been used to indicate that a signal $F_A$ from the predictor PD may be sent directly to the actuator system ACS. In this embodiment, the predictor PD may not send signal Δ to the control system CS. In this embodiment, the control system CS may determine a force F to be applied to the object OB based on the output OP from the position measurement system PMS, and the set point SP. In addition, the predictor may determine an estimated offset force based on the measurement signal SIG. In this embodiment, the control system CS controls the actuator system ACS to position the object OB as accurately as possible, and the predictor PD indicates an offset to the force F to be applied to account for any error between the measured point and the point of interest.

In the above embodiments, inertial forces in the fluid CF affect the positioning of the object. However, using the measured pressure allows the lithographic apparatus LA to adapt the force F applied to the object OB to better position the object OB.

In the above embodiments, the adverse effects of the temperature conditioning system on the object can be measured, and used when controlling the position of the object in some way. Therefore, the position of the object OB can be altered to reduce, or even remove, any adverse effects of using a temperature conditioning system.

FIG. 4 depicts a schematic top view of an object OB including a conduit system CCS for receiving fluid CF to control the temperature of the object OB. Part of the conduit system CCS may for instance be formed in the object OB by milling and subsequently covering the milled conduit system CCS with a top part (not shown). The object OB may be formed with or without the conduit system CCS formed in the object OB, for example, by electrical discharge machining, chemical etching, milling, chemical vapour infiltration, for example using SiC, or a combination of any of these processes.

The conduit system CCS is preferably part of a temperature conditioning system (not shown) comprising a heat exchanger and a pump. The heat exchanger is configured to thermally condition the fluid CF before the fluid CF is applied to the object OB. The pump is configured to transport the fluid CF from and to the object OB. The fluid CF is provided throughout the conduit system CCS. The object OB in FIG. 4 is moveable in at least the two directions corresponding to the X-direction and the Y-direction.

In FIG. 4, the conduit system CCS is made up of a conduit portion CC and a conduit connecting portion CCP. As can be seen, the conduit portion CC of the conduit system CCS may be arranged around the circumference of the object OB. The conduit portion CC may refer to the part of the conduit system CCS which is on, or in, the object OB. For example, where a part of the wall of the conduit system CCS is in contact with the object OB. In this instance, the conduit connecting portions CCP are the part or parts of the conduit system CCS which do not have a part of the wall of the conduit system CCS in contact with the object OB. In FIG. 4, the point at which the wall of the conduit system CCS is no longer in direct contact with the object OB, i.e. at the edge of the object OB, is where the conduit portion CC and the conduit connecting portions CCP connect.

In an embodiment, the conduit portion CC and the conduit connecting portion CCP may be one tube i.e. an unbroken tube. In an embodiment, the conduit portion CC may be a channel within the object OB, and each conduit connecting portion CCP may each be a separate tube connected to the conduit portion CC.

In an alternative embodiment, the conduit connecting portion CCP and the conduit portion CC may each be formed by using separate tubes connected together. The conduit connecting portion CCP may comprise two tubes, each of which is connected to the conduit portion CC at the edge of the object OB. Furthermore, the conduit portion CC and the conduit connecting portions CCP may be different. For example, a different material may be used for the different portions and/or a different cross-sectional shape.

In the above embodiments, reference to the conduit portion CC and the conduit connecting portion CCP defines the difference between a part of the conduit system CCS in which the wall of the conduit is in direct contact with the object OB at that point. However, a tube may be used for the conduit portion CC which extends into part of at least one of the conduit connecting portions CCP. Alternatively, or additionally, a tube used for a conduit connecting portion CCP may extend into the conduit portion CC. In this way, multiple tubes may be used which have connection to each other at some point in the conduit system CCS.

There may be a connector (not shown) between the conduit portion CC and each of the conduit connecting portions CCP or between tubes used for the portions as described above. Each connector may comprise a straight segment and/or may have a set radius or bend to redirect the conduit system CCS in a specific direction.

Pressure pulse limiters PPL have been shown in FIG. 4 at the end of two conduit connecting portions CCP. A measurement system MS may be provided on one of the conduit connecting portions CCP as shown in FIG. 4. As previously described in relation to FIG. 3, the measurement system MS detects the pressure of the fluid CF inside the conduit system CCS.

The measurement system MS may comprise a pressure sensor SE to measure the pressure of the fluid CF in the conduit system CCS and may send a measurement signal SIG corresponding to the measured pressure to the predictor PD (not shown in FIG. 4). This measurement is used by the control system CS (or the predictor as described above) to minimise the effect of disturbances applied to the object OB due to the presence of the temperature conditioning system.

In an embodiment, the measurement system MS is provided at a location as close as possible to the object OB. Measurements taken close to the object OB more accurately represent the pressure of the fluid CF in the object OB than if taken further away.

As mentioned, the system may be modelled as a dynamical system, wherein the control system CS uses the output of such a model i.e. the estimated offset, to control the movement of an object OB. As previously mentioned, due to the pressure pulse limiters PPL, the conduit system CCS as depicted in FIG. 4 can be modelled as an isolated system i.e. with no pressure variation in the conduit system CCS from outside the connector to the pressure pulse limiter PPL. The measurement system MS allows measurement of the pressure variation within the conduit system CCS such that this can be included in the control system CS calculations to determine the position of the object OB. As described above, the predictor PD can determine the estimated offset due to the temperature conditioning system which corresponds to the variation in pressure detected by the measurement system MS. In an alternative embodiment, the predictor PD may convert the measurement signal SIG directly into a force (which may have a signal also represented by $\Delta$ in FIG. 3) which is factored into the control system CS. Alternatively, the predictor PD may send a signal $F_A$ representative of a force directly to the actuator system ACS to adapt the control of the object OB.

In the above embodiment, the object OB is described with one conduit system CCS. However, there may be multiple conduit systems CCS, all of which are partly in or on the same object OB. Furthermore, the conduit system CCS is shown with a simple circular shape around the circumference of the object OB. However, the shape of the conduit system CCS (or each conduit system CCS) can be a different shape. The shape of the conduit system CCS may affect the pressure distribution within the object OB.

In FIG. 4 of the present invention, the measurement system MS is shown on the conduit connecting portion CCP. The measurement system MS is shown to be between the object OB and the pressure pulse limiter PPL. The measurement system MS is located such that the pressure can be accurately measured in the object OB. This location may be as close as possible to the object OB. The location of the measurement system MS may be optimised depending on the characteristic being measured and/or the movement of the object. The measurement system MS may be placed at any point on the conduit system CCS. The measurement system MS may be located on the conduit portion CC. The measurement system MS may be located on or in the object OB. The sensor SE may be directly connected to the measurement system MS. Alternatively, the sensor SE may not be directly connected to the measurement system MS and for example, may wirelessly transmit measurements to the measurement system MS. The location of the measurement system MS described above may be the location of the sensor SE itself and/or the location of the measurement system MS.

The fluid CF provided in the conduit system CCS is supplied from a source (not shown) external to the conduit system CCS shown in FIG. 4. The fluid CF is supplied via a tube and/or hose from the source external to the pressure pulse limiters PPL. The fluid CF is a liquid and/or a gas. For example, the fluid CF may be conditioned water, $CO_2$ fluid, a mixture of gas and liquid $CO_2$, helium fluid, glycol, or a refrigerant, for example freon, etc.

In FIG. 4, two pressure pulse limiters PPL are located at similar locations at the same distance from the object OB. However, the pressure pulse limiter PPL may be at different locations and/or distances from the object OB. One pressure pulse limiter PPL may be located anywhere on the carrier system or conduit system CCS. Alternatively, multiple pressure pulse limiters PPL may be provided.

In FIG. 4, the present embodiment is shown to have one sensor SE in the measurement system MS. However, multiple sensors may be used.

In the above embodiments, the measurement system MS comprises a sensor SE to directly measure the fluid pressure of the fluid CF. In an embodiment, the measurement system MS comprises a sensor SE to indirectly measure the fluid pressure of the fluid CF. A sensor SE which indirectly measures the pressure may, for example, measure a different characteristic of the conduit system CCS other than the pressure. For example, a strain sensor such as a strain gauge pressure sensor may be used to measure strain in the wall of the conduit system CCS. A strain measurement may be used to estimate a pressure and this can be used to determine the estimated offset or estimated offset force, used to control object OB as described above. Any type of strain sensor may be used to measure the strain, for example a piezoelectric strain sensor. Preferably, the strain sensor used is configured to measure the strain in the order of n$\varepsilon$, maybe even p$\varepsilon$. The strain sensor may be located on the outside, inside or in a wall of the conduit system CCS. Alternatively, the different characteristic of the conduit system CCS which may be measured may be the density of the fluid CF, an optical characteristic of the fluid CF for example using a birefringence sensor, or an interferometer, etc.

In an embodiment, the conduit system CCS may be entirely contained within the object OB. In this embodiment, the conduit system CCS may only comprise a conduit portion CC. In this embodiment, the measurement system MS may measure the pressure of the conduit system CCS within the object OB. For example, the conduit system CCS may be filled with conditioned water and the ports may be sealed before the object OB is accelerated. In this embodiment, the conduit system CCS may not comprise a pressure pulse limiter PPL. In a sealed system, when the object OB is accelerated, the pressure will increase in some areas and decrease in others. Due to pressure variation, deformation of the object OB would still occur, but the relationship between the pressure and the estimated offset would be different and may have to be modelled differently. Apart from these differences, the embodiments as described above may be used to detect the pressure and control the movement of the object OB.

In this embodiment, the measurement system MS may also be within the object OB and may transmit the measurement signal SIG wirelessly to the control system CS. The conduit system CCS may also comprise only the conduit portion CC, i.e. one portion entirely within the object OB. Although as described above, the conduit portion CC may be comprised of multiple tubes, wherein none of these tubes extend out of, or off the object. The tubes may be different in that they have different diameters, cross-sections and/or are different types of tube.

The predictor PD may or may not be a part of the lithographic apparatus control unit LACU i.e. the predictor PD may be a separate control unit. The predictor PD may be separate from the control system CS within the LACU, as depicted in FIG. 3. Alternatively, the predictor PD may be part of the control system CS, such that the control system receives the measurement signal SIG from the measurement system MS and uses this directly.

In accordance with the above embodiments, the object OB may be a substrate table WT, support structure MT, an optical element, the projection system PS, first positioner PM, second positioner PW, or any other object OB which may need to be positioned in lithographic apparatus, where applicable.

It is possible that the positioning accuracy in X-direction is not as demanding as it is for the Y-direction, or that the required positioning accuracy is only applicable when the object OB is accelerated in Y-direction only, so that the behaviour in X-direction is less relevant. Therefore, it may be useful to control the object OB based on the output Δ of the measurement system MS even if only in one direction. The above embodiments use the X, Y and Rz, directions as examples of directions in which the object OB may be moved or positioned. However, the object OB may be moved or positioned in any axis direction including the X, Y and/or Z directions and the rotational directions relative to those directions, or along a direction based on any other axis which may be rotated or translated relative to the X-Y axis depicted in the Figures.

In accordance with the above embodiments, the point of interest may change. For example, if the object OB is a substrate table WT supporting a substrate W, then the substrate may be moved to expose different target portions C of the substrate W. In this case, the point of interest on the substrate W will change. After the estimated offset has been determined for a particular point of interest, it may be possible to use the estimated offset for other points of interest. For example, it may be assumed that the magnitude of the estimated offset is constant at a given radius (even if the direction of the estimated offset varies). Therefore, the estimated offset from one point of interest may be used for other points of interest, for example, other points at the same radius.

In an embodiment in accordance with any of the above embodiments, a pressure pulse limiter PPL may not be provided. In this embodiment, the pressure variations due to movement of the object may be larger due to the lack of a pressure pulse limiter PPL, but the control system may be used to move the object OB to counteract the effect of pressure variations as described above.

In an embodiment the pressure pulse limiter PPL may be active. In this case, active means that the pressure pulse limiter PPL may be controlled to affect the pressure of the fluid CF inside the conduit system CCS. This may be based on the output SIG from the measurement system MS.

In the above embodiments, the estimated offset is used in the control system to control the movement of the object OB whilst using the measurement signal SIG to account for the effect of pressure variation in the fluid. However, the estimated offset my not be used by the control system in this way. As an alternative, the estimated offset may be applied as a measurement system correction on the position measured by a position sensor. As such, a measurement, which has been adapted to account for pressure variation, may be used by the control system directly for comparison with the desired position of a point of interest. In this way, the control system controls the position of the object OB based on an input relating to the set point SP and the output OP from the position measurement system PMS which will be more accurate because the variation in distance between the measured point and the point of interest has been included.

Further to the induced pressure pulses, there are force disturbances in the fluid CF due to irregularities in the path of the fluid CF within the conduit system CCS. These force irregularities may be referred to as flow noise in the fluid CF. The flow noise may excite certain resonant modes of the fluid CF, depending on the location of the noise with respect to the pressure distribution of the fluid CF. Each mode may affect the object OB in different ways and to different extents. The flow noise may generate a disturbance force in directions other than the acceleration direction i.e. may induce a force on the object. The measurement system PRS may be used to measure the disturbance force, and a measurement signal SIG indicative of the disturbance forces may be generated. The measurement signal SIG can be used by the predictor PD (or control system CS) to determine the effect of the flow noise and account for the flow noise in the control of the movement of the object OB.

The above embodiments may be used to reduce the effect of disturbance forces due to flow noise in the fluid CF. This may be done instead of, or in addition to reducing the effect of pressure pulses as described above. In order to reduce the effect of flow noise, different sensors may be used. At least one sensor may be used to measure a characteristic of the conduit system CCS which is configured to take measurements fast enough to accurately measure the effects of the flow noise. The effect of the flow noise can also be factored into the positioning of the object OB by the control system CS in any of the above embodiments.

In any of the above embodiments, the pressure gradients due to acceleration of the object OB and the flow noise may cause disturbance forces to act on the object OB which cause an error in the positioning of the object OB. The error in the positioning of the object OB may lead to a direct offset in the point of interest. The offset can be determined as in the above embodiments and as such, the object OB can be controlled to reduce the effect of any disturbance forces. This may be done using any of the above embodiments, for example by determining a position offset, for example using a measurement or a prediction of the pressure of the fluid CF at a point, or by sending a signal to indicate the force offset straight to the actuators.

In an embodiment of the present invention, a conduit system CCS is provided with a fluid CF wherein at least part of the conduit system CCS is arranged on or in an object. In this embodiment, other features may be the same as any of the above embodiments except that a measurement system PRS to provide a measurement signal SIG indicative of pressure of fluid within the conduit system is not provided.

In the present embodiment, a model may be used, for example, as described in relation to the mass and spring system, to predict the variation of the pressure of the fluid CF. A pressure predictor system may be used to generate a signal indicative of the predicted pressure. The pressure predictor system may or may not be part of the lithographic apparatus control unit LACU. The predicted pressure may be used as in the above embodiments in a control system CS to control the movement of the object OB. Using a model in this way allows a reduction in the adverse effects of a temperature conditioning system as described in the above embodiments.

In an embodiment, there is provided a lithographic apparatus comprising: an object that is movable in at least one direction; a conduit system for conveying a fluid, wherein at least part of the conduit system is arranged on or in the object; a measurement system comprising a sensor to provide a measurement signal which is indicative of a pressure of the fluid at at least one location within the conduit system; and a control system to control the movement of the object in the at least one direction under control of the measurement signal.

In an embodiment, the movement of the object induces a change in the pressure of the fluid and the measurement system is configured to detect the change in the pressure of the fluid. In an embodiment, the conduit system comprises a conduit portion and a conduit connecting portion, wherein the conduit portion is arranged on or in the object, wherein the conduit connecting portion is not arranged on or in the object, wherein the conduit portion and the conduit connecting portion are connected to each other, and wherein the sensor is located at the conduit connecting portion. In an embodiment, the control system further comprises at least one pressure pulse limiter connected to the conduit connecting portion, and wherein the sensor is located at the conduit connecting portion between the object and the pressure pulse limiter. In an embodiment, the conduit system comprises a conduit portion and a conduit connecting portion, wherein the conduit portion is arranged on or in the object, wherein the conduit connecting portion is not arranged on or in the object, wherein the conduit portion and the conduit connecting portion are connected to each other, and wherein the sensor is located on or at a location on the conduit portion. In an embodiment, the sensor is a pressure sensor to measure the pressure at the least one location to provide the measurement signal. In an embodiment, the sensor is a strain gauge configured to provide the measurement signal, the measurement signal being representative of a strain in a part of a wall of the conduit system at the at least one location, wherein the strain correlates to the pressure. In an embodiment, the lithographic apparatus further comprises an actuator system and a position measurement system, wherein the position measurement system is arranged to provide a position signal representative of a position of the object, wherein the controller is configured to control the actuator system to move the object under control of the position signal. In an embodiment, an acceleration of the object causes a pressure gradient, wherein the sensor is configured to provide the measurement signal representative of the pressure gradient. In an embodiment, the lithographic apparatus further comprises a pump to convey the fluid along the conduit system, wherein the fluid flow has a flow noise, and wherein the sensor is configured provide the measurement signal representative of the flow noise. In an embodiment, the lithographic apparatus comprises a projection system, a substrate table and a support structure, wherein the projection system is configured for projecting a pattern arranged on a patterning device onto a substrate, wherein the support structure is configured for holding the patterning device, wherein the substrate table is configured for holding the substrate, and wherein the object comprises at least one of the support structure and substrate table. In an embodiment, the at least one direction corresponds to a main moving direction during a critical operation of the object.

In an embodiment, there is provided an object positioning system comprising: an object that is movable in at least one direction; a conduit system for conveying a fluid, wherein at least part of the conduit system is arranged on or in the object; a measurement system comprising a sensor to provide a measurement signal which is indicative of a pressure of the fluid at at least one location within the conduit system; and a control system to control the movement of the object in the at least one direction under control of the measurement signal.

In an embodiment, there is provided a device manufacturing method wherein use is made of a lithographic apparatus as described herein.

In an embodiment, there is provided a lithographic apparatus comprising: an object that is movable in at least one direction; a conduit system for conveying a fluid, wherein at least part of the conduit system is arranged on or in the object; a pressure predictor system configured to generate a signal which is indicative of a predicted pressure of the fluid at at least one location within the conduit system; and a control system to control the movement of the object in the at least one direction under control of the signal.

While specific embodiments of the invention have been described above, it will be appreciated that the invention may be practiced otherwise than as described. For example, the control system of the invention may take the form of a computer program containing one or more sequences of machine-readable instructions describing a method as disclosed above, or a data storage medium (e.g. semiconductor memory, magnetic or optical disk) having such a computer program stored therein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate W referred to herein may be processed, before or after exposure, in for example a track (a tool that typically applies a layer of resist to a substrate W and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate W that already contains multiple processed layers.

Although specific reference may have been made above to the use of embodiments of the invention in the context of optical lithography, it will be appreciated that the invention may be used in other applications, for example imprint or e-beam lithography, and where the context allows, is not limited to optical lithography. In imprint lithography a topography in a patterning device defines the pattern created on a substrate W. The topography of the patterning device MA may be pressed into a layer of resist supplied to the substrate W whereupon the resist is cured by applying electromagnetic radiation, heat, pressure or a combination thereof. The patterning device MA is moved out of the resist leaving a pattern in it after the resist is cured.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
an object that is movable in at least one direction;
a temperature conditioning system configured to control a temperature of the object, wherein the temperature conditioning system comprises a conduit system configured to convey a fluid, wherein at least part of the conduit system is arranged on or in the object and wherein the at least part of the conduit system is sealed off on the object when controlling the temperature of the object or the conduit system further comprises a duct connected to the object to supply the fluid to the object;
a measurement system comprising a sensor to provide a measurement signal which is indicative of a pressure of the fluid at at least one location within the conduit system; and
a control system to control the movement of the object in the at least one direction under control of the measurement signal.

2. The lithographic apparatus of claim 1, wherein the movement of the object induces a change in the pressure of the fluid and the measurement system is configured to detect the change in the pressure of the fluid.

3. The lithographic apparatus according to claim 1, wherein the conduit system comprises a conduit portion and a conduit connecting portion, wherein the conduit portion is arranged on or in the object, wherein the conduit connecting portion is not arranged on or in the object, wherein the conduit portion and the conduit connecting portion are connected to each other, and wherein the sensor is located at the conduit connecting portion.

4. The lithographic apparatus according to claim 3, wherein the control system further comprises at least one pressure pulse limiter connected to the conduit connecting portion, and wherein the sensor is located at the conduit connecting portion between the object and the pressure pulse limiter.

5. The lithographic apparatus according to claim 1, wherein the conduit system comprises a conduit portion and a conduit connecting portion, wherein the conduit portion is arranged on or in the object, wherein the conduit connecting portion is not arranged on or in the object, wherein the conduit portion and the conduit connecting portion are connected to each other, and wherein the sensor is located on or at a location on the conduit portion.

6. The lithographic apparatus according to claim 1, wherein the sensor is a pressure sensor to measure the pressure at the least one location to provide the measurement signal.

7. The lithographic apparatus according to claim 1, wherein the sensor is a strain gauge configured to provide the measurement signal, the measurement signal being representative of a strain in a part of a wall of the conduit system at the at least one location, wherein the strain correlates to the pressure.

8. The lithographic apparatus according to claim 1, further comprising an actuator system and a position measurement system, wherein the position measurement system is arranged to provide a position signal representative of a position of the object, wherein the controller is configured to control the actuator system to move the object under control of the position signal.

9. The lithographic apparatus according to claim 1, wherein an acceleration of the object causes a pressure gradient, wherein the sensor is configured to provide the measurement signal representative of the pressure gradient.

10. The lithographic apparatus according to claim 1, further comprising a pump to convey the fluid along the conduit system, wherein the fluid flow has a flow noise, and wherein the sensor is configured provide the measurement signal representative of the flow noise.

11. The lithographic apparatus according to claim 1, comprising a projection system, a substrate table and a support structure, wherein the projection system is configured to project a pattern arranged on a patterning device onto a substrate, wherein the support structure is configured to hold the patterning device, wherein the substrate table is configured to hold the substrate, and wherein the object comprises the support structure and/or the substrate table.

12. The lithographic apparatus according to claim 1, wherein the at least one direction corresponds to a main moving direction during a critical operation of the object.

13. The lithographic apparatus according to claim 1, comprising a predictor configured to convert the measurement signal to represent an estimated offset of the object.

14. An object positioning system comprising:
an object that is movable in at least one direction;
a temperature conditioning system configured to control a temperature of the object, wherein the temperature conditioning system comprises a conduit system configured to convey a fluid, wherein at least part of the conduit system is arranged on or in the object and wherein the at least part of the conduit system is sealed off on the object when controlling the temperature of the object or the conduit system further comprises a duct connected to the object to supply the fluid to the object;
a measurement system comprising a sensor to provide a measurement signal which is indicative of a pressure of the fluid at at least one location within the conduit system; and
a control system to control the movement of the object in the at least one direction under control of the measurement signal.

15. A device manufacturing method, comprising:
moving an object in at least one direction;
controlling a temperature of the object using a temperature conditioning system, wherein the temperature conditioning system comprises a conduit system configured to convey a fluid, wherein at least part of the conduit system is arranged on or in the object and wherein the at least part of the conduit system is sealed off on the object when controlling the temperature of the object or the conduit system further comprises a duct connected to the object to supply the fluid to the object;
providing, by a sensor, a measurement signal which is indicative of a pressure of the fluid at at least one location within the conduit system; and
controlling the movement of the object in the at least one direction under control of the measurement signal.

16. The method according to claim 15, wherein the movement of the object induces a change in the pressure of the fluid and the measuring comprises detecting the change in the pressure of the fluid.

17. The method according to claim 15, wherein the sensor is a strain gauge, and wherein the measurement signal is representative of a strain in a part of a wall of the conduit system at the at least one location, wherein the strain correlates to the pressure.

18. The method according to claim 15, further comprising using a pump to convey the fluid along the conduit system, wherein the fluid flow has a flow noise, and wherein the measurement signal is representative of the flow noise.

19. The method according to claim 15, wherein the conduit system comprises a conduit portion and a conduit connecting portion, wherein the conduit portion is arranged on or in the object, wherein the conduit connecting portion is not arranged on or in the object, wherein the conduit portion and the conduit connecting portion are connected to each other, and wherein the sensor is located at the conduit connecting portion.

20. The method according to claim 15, comprising converting the measurement signal to represent an estimated offset of the object.

* * * * *